US006985008B2

(12) United States Patent
Lundberg

(10) Patent No.: US 6,985,008 B2
(45) Date of Patent: Jan. 10, 2006

(54) APPARATUS AND METHOD FOR PRECISELY CONTROLLING TERMINATION IMPEDANCE

(75) Inventor: James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 111 days.

(21) Appl. No.: 10/730,169

(22) Filed: Dec. 5, 2003

(65) Prior Publication Data

US 2004/0113652 A1 Jun. 17, 2004

Related U.S. Application Data

(60) Provisional application No. 60/433,551, filed on Dec. 13, 2002.

(51) Int. Cl.
*H03K 19/003* (2006.01)
*H03K 17/16* (2006.01)

(52) U.S. Cl. .......................... 326/30; 326/87; 327/112; 327/316

(58) Field of Classification Search ................ 326/30, 326/26–28, 86–87; 327/108, 109, 112, 316
See application file for complete search history.

(56) References Cited

U.S. PATENT DOCUMENTS

| 4,719,369 | A | | 1/1988 | Asano et al. |
| 5,194,765 | A | * | 3/1993 | Dunlop et al. ................ 326/87 |
| 5,444,397 | A | | 8/1995 | Wong et al. |
| 5,457,407 | A | | 10/1995 | Shu et al. |
| 5,479,123 | A | | 12/1995 | Gist et al. |
| 5,657,456 | A | | 8/1997 | Gist et al. |
| 5,666,078 | A | * | 9/1997 | Lamphier et al. ........... 327/108 |
| 5,955,894 | A | * | 9/1999 | Vishwanthaiah et al. ..... 326/86 |
| 6,087,847 | A | * | 7/2000 | Mooney et al. ............... 326/30 |
| 6,088,756 | A | | 7/2000 | Munoz-Bustamante |
| 6,133,749 | A | | 10/2000 | Hansen et al. |
| 6,163,499 | A | | 12/2000 | Suzuki |
| 6,326,802 | B1 | | 12/2001 | Newman et al. |
| 6,384,621 | B1 | | 5/2002 | Gibbs et al. |
| 6,509,778 | B2 | | 1/2003 | Braceras et al. |
| 6,624,662 | B1 | | 9/2003 | Volk |
| 6,661,250 | B2 | * | 12/2003 | Kim et al. .................... 326/30 |
| 6,667,633 | B2 | | 12/2003 | Fifield et al. |
| 6,690,211 | B1 | | 2/2004 | Huang et al. |

* cited by examiner

*Primary Examiner*—Daniel Chang
(74) *Attorney, Agent, or Firm*—Gary R. Stanford; Richard K. Huffman; James W. Huffman

(57) ABSTRACT

An impedance controller that controls termination impedance of at least one output based on a reference value including a programmable reference impedance generator, at least one termination logic element, and an impedance matching controller. The programmable reference impedance generator develops a reference impedance controlled by a reference impedance control input. Each termination logic element includes a programmable termination impedance generator coupled to a corresponding output and controlled by termination impedance control input. The impedance matching controller continually adjusts the reference impedance control input to match the reference impedance with the reference value within a predetermined tolerance and generates the termination impedance control input based on the reference impedance control input.

20 Claims, 4 Drawing Sheets

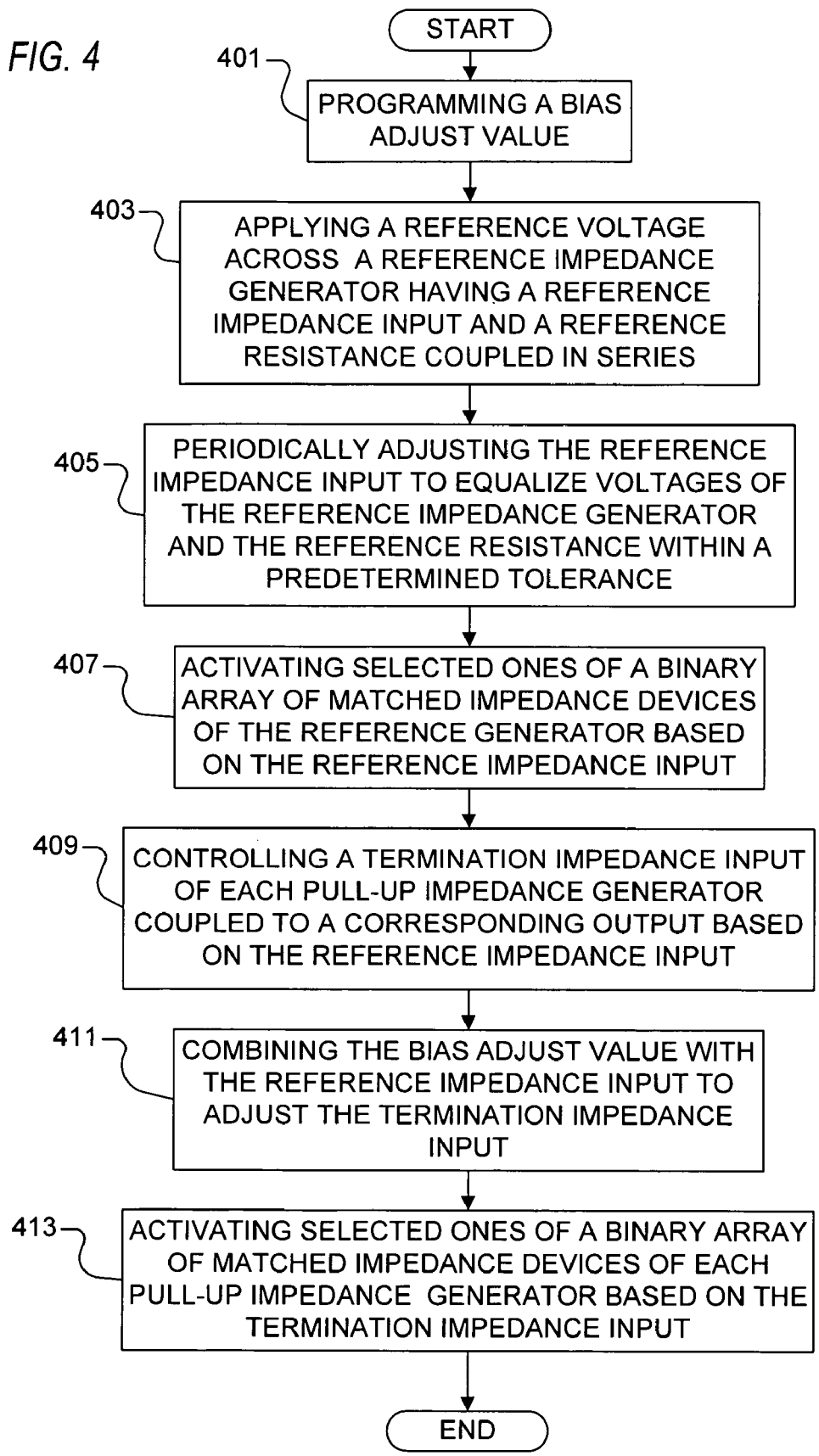

APPARATUS AND METHOD FOR PRECISELY CONTROLLING TERMINATION IMPEDANCE

CROSS-REFERENCE TO RELATED APPLICATIONS

This application claims the benefit of U.S. Provisional Application No. 60/433,551, filed on Dec. 13, 2002, which is herein incorporated by reference for all intents and purposes.

This application is related to the following co-pending U.S. Patent Applications, which are filed on the same day as this application, which has a common assignee and at least one common inventor, and which is herein incorporated by reference in its entirety for all intents and purposes:

| SERIAL NUMBER | DOCKET NUMBER | TITLE |
| --- | --- | --- |
| 10/730,389 | CNTR.2116 | OUTPUT DRIVER IMPEDANCE CONTROLLER |
| 10/730,435 | CNTR.2118 | APPARATUS AND METHOD FOR ADJUSTING THE IMPEDANCE OF AN OUTPUT DRIVER |

BACKGROUND OF THE INVENTION

1. Field of the Invention

The present invention relates to IC output driver circuits, and more particularly to a method and apparatus for providing precise on-chip bus pull-up impedance for N-channel open drain output drivers where the impedance presented to the bus is insensitive to fluctuations in temperature and voltage, and variations due to fabrication.

2. Description of the Related Art

In earlier integrated circuit (IC) designs, CMOS output drivers were configured as push-pull elements. Consequently, the noise seen on an output bus fluctuated significantly in response to various factors, including circuit temperature, supply voltage, fabrication process differences, the number of devices on the bus, etc. In more recent years, as technological advances have resulted in the scaling of device size and voltage levels, designers have been forced to aggressively address noise problems on external buses in order to maximize the operating speed of circuits within a system. A bus typically includes one or more signal lines collectively routed on a system board or the like, where each signal line can be modeled as a transmission line subject to noise (e.g., reflections, cross-talk, etc.).

One aspect of more recent output driver solutions has been a move in the industry from push-pull output configurations to differential receiver configurations. In a differential receiver configuration, one side of a differential receiver is supplied with a reference voltage and the other side is driven by an open drain N-channel device. The open drain N-channel devices are provided on-chip and bus pull-up terminations are generally provided externally, typically on a system motherboard or the like. Providing pull-up terminations on a motherboard grants system designers a level of flexibility to address bus noise problems that has heretofore been unavailable.

The aforementioned types of output drivers have become prevalent within the industry. One particular example of this prevalence is exhibited by the Pentium® II x86 microprocessor, a product of the Intel® Corporation. The Pentium II employs open drain N-channel output devices to drive a 1.5 Volt (V) bus having a 1.0 V reference threshold. Motherboards for this processor generally employ 56 ohm pull-up terminations. Although no particular pull down impedance has been specified, open drain output drivers have been used to comply with bus switching and timing specifications. Without compensating for process, voltage, and temperature variations, however, the channel resistance of an open drain N-channel output driver can vary anywhere from approximately 4 to 80 ohms. And since microprocessor designers can only anticipate acceptable limits for process, voltage, and temperature fluctuations, they have been compelled in Pentium II motherboard-compatible designs to add slew rate controls on the order of 2–3 nanoseconds (ns) to output signal edges to reduce noise on output buses.

With the Pentium III®, Intel introduced a means whereby designers are provided with a reference impedance that can be used to set the impedance of the output drivers on the bus. A pin on the processor package, referred to as NCHCTRL, is connected to the bus voltage, referred to as VTT, through a precision 14 ohm resistor, with a maximum specified resistance of 16 ohms. The precision resistor is external to the microprocessor chip and is therefore independent of the temperature and voltage variations seen by output drivers on the chip. In addition, pull-up terminations for compatible configurations are to be provided on-chip rather than on the motherboard of a system. And another pin, RTT, is provided, to which a precision resistor, R, is to be connected between the pin and ground. The impedance across the precision resistor indicates the desired impedance for all pull-up terminations. Hence, a system designer is able to set the bus pull-up impedance for all of the signals on a part through one external resistor. By specification, the resistor can range from 40 to 130 ohms, thus enabling system designers to adjust the pull-up terminations on N-channel open drain buses to compensate for noise or loading.

SUMMARY OF THE INVENTION

An impedance controller that controls termination impedance of at least one output based on a reference value according to an embodiment of the present invention includes a programmable reference impedance generator, at least one termination logic element, and an impedance matching controller. The programmable reference impedance generator develops a reference impedance controlled by a reference impedance control input. Each termination logic element includes a programmable termination impedance generator coupled to a corresponding output and controlled by termination impedance control input. The impedance matching controller continually adjusts the reference impedance control input to match the reference impedance with the reference value within a predetermined tolerance and generates the termination impedance control input based on the reference impedance control input.

In a specific embodiment, the programmable reference impedance generator and each programmable termination impedance generator includes a binary array of matched P-channel devices. In one embodiment, the impedance generators each provide a pull-up impedance relative to a source voltage. The impedance matching controller may include a voltage sensor and impedance control logic. In this case, the voltage sensor senses a voltage difference between a reference voltage developed across the reference device and a voltage of the programmable reference impedance generator and asserts an error signal indicative thereof. The impedance control logic adjusts the reference impedance control input based on the error signal. In one embodiment, the reference value is a reference resistor, where a voltage source is applied across the reference resistor and the programmable reference impedance generator coupled in series at an intermediate junction. The voltage sensor asserts the error signal indicative of voltage of the intermediate junction relative to one-half of a voltage level of the voltage source.

In one embodiment, the impedance control logic receives a clock signal and increments or decrements the reference impedance control input during selected cycles of the clock signal. The impedance matching controller may further include bias adjustment logic that combines a bias amount with the reference impedance control input to provide the termination impedance control input. Output bias logic, such as programmable fuses or the like, may be included that is programmed to provide the bias amount.

An integrated circuit (IC) according to an embodiment of the present invention includes a reference pin for coupling to an external reference resistor and at least one output pin, at least one termination logic element, and impedance matching logic. Each termination logic element includes a programmable termination impedance generator controlled by a termination impedance control input and is coupled to a corresponding output pin. The impedance matching logic includes a programmable reference impedance generator controlled by a reference impedance control input, comparator logic, and output termination logic. The comparator logic continually adjusts the reference impedance control input to equalize values of the reference resistor and the programmable reference impedance generator within a predetermined tolerance. The output termination logic controls the termination impedance control input based on the reference impedance control input.

The IC may include output bias logic that provides an adjustment value, in which case the output termination logic may include bias adjustment logic that combines the reference impedance control input with the adjustment value to provide the termination impedance control input. The programmable reference impedance generator and each programmable termination impedance generator may be implemented as a binary array of matched P-channel impedance devices.

A method of controlling pull-up termination impedance of at least one output based on a reference resistance includes applying a reference voltage across the reference resistance and a reference impedance generator coupled in series, the reference impedance generator having a reference impedance input, periodically adjusting the reference impedance input to equalize voltages of the reference impedance generator and the reference resistance within a predetermined tolerance, and controlling a termination impedance input of at least one pull-up impedance generator based on the reference impedance input, where each pull-up impedance generator being coupled to a corresponding output.

The method may further include sensing voltage at an intermediate junction of the reference impedance generator and the reference resistance. In this case, the method may include comparing the voltage at the intermediate junction with one-half of the reference voltage. The periodically adjusting the reference impedance input may include incrementing or decrementing a digital value during selected cycles of a clock signal. The method may further include programming a bias adjust value and combining the bias adjust value with the reference impedance input. The method may further include activating selected ones of a binary array of matched P-channel devices of the reference impedance generator based on the reference impedance input, and activating selected ones of a binary array of matched P-channel devices of each pull-up impedance generator based on the termination impedance input.

BRIEF DESCRIPTION OF THE DRAWINGS

The benefits, features, and advantages of the present invention will become better understood with regard to the following description, and accompanying drawings where:

FIG. 4 is a flowchart diagram illustrating a method of controlling the pull-up termination impedance of at least one output based on a reference resistance according to an exemplary embodiment of the present invention.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for monitoring the external precision resistor and for adjusting the pull-up impedance of the bus pull-up termination devices on the chip so that they match the impedance seen through the precision resistor. He has therefore developed an apparatus and method for precisely controlling the termination impedance of a transmission line, as will be further described below with respect to FIGS. 1–4.

Figure 1:
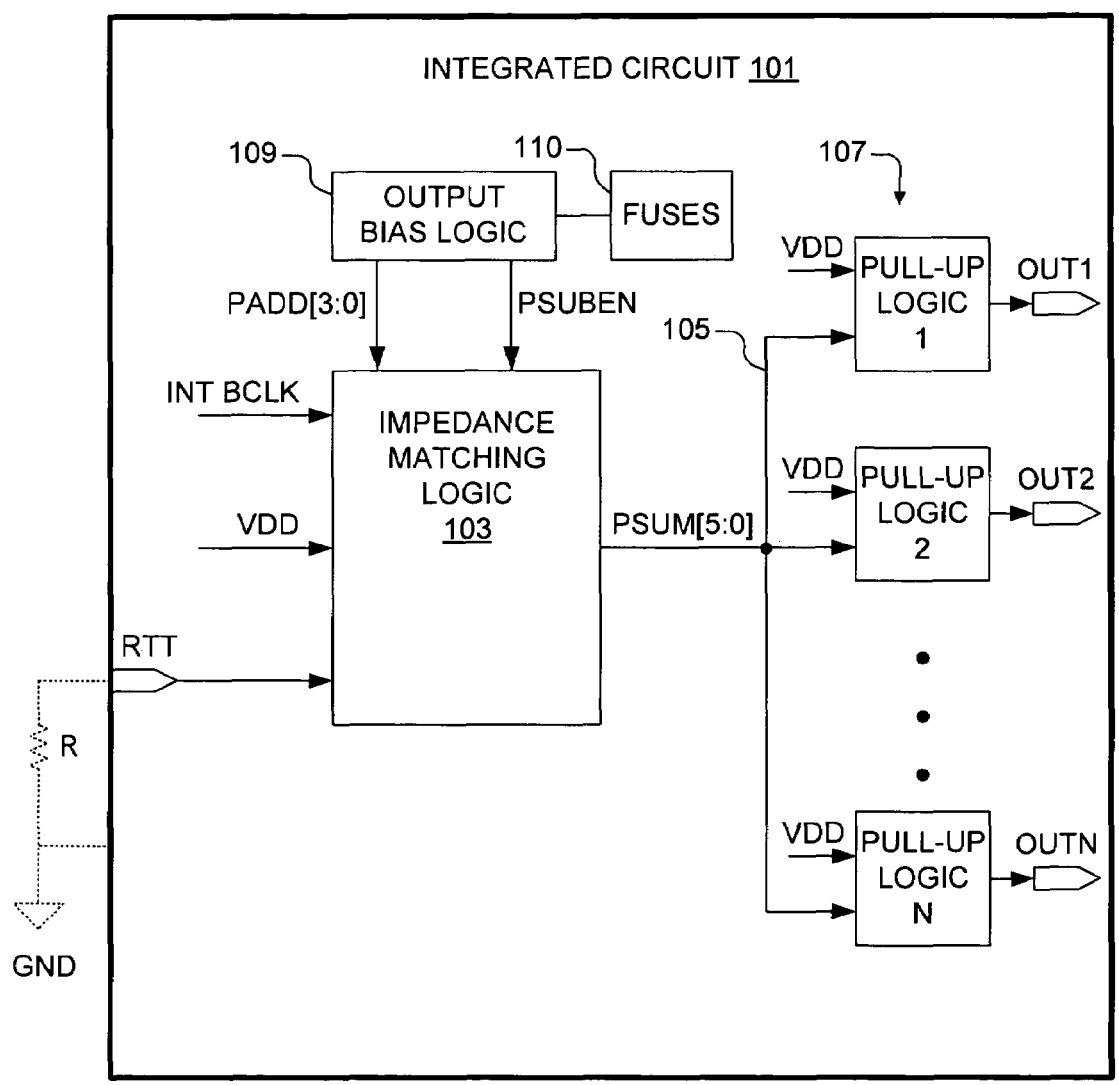
FIG. 1 is a simplified block diagram of an integrated circuit (IC) including an system for precisely controlling the termination impedance of a transmission line according to an exemplary embodiment of the present invention.

FIG. 1 is a simplified block diagram of an integrated circuit (IC) 101 including an system for precisely controlling the termination impedance of a transmission line according to an exemplary embodiment of the present invention. The IC 101 includes several externally-available input/output (I/O) pins, including a reference resistor pin RTT and multiple output pins, individually shown as OUT1, OUT2, . . . , OUTN, where N is a positive integer. A pin and the signal it carries are called by the same name unless otherwise specified. The IC 101 develops a voltage reference signal or otherwise receives voltage supply signal VDD. The VDD signal may be provided from an external pin relative to a ground (GND) pin (not shown). In the embodiment shown, an external reference resistor R, shown in dashed lines, is coupled between pins RTT and ground. By specification, the resistor R ranges anywhere between 40 to 130 ohms and may be a precision resistor or the like (e.g., a 1% resistor), although the present invention is not limited to any specific value, range or resistor type. In addition, it is anticipated that a voltage other than VDD will be provided according to the present invention. For example, provision of a VTT voltage is comprehended as has been described above.

Figure 2:
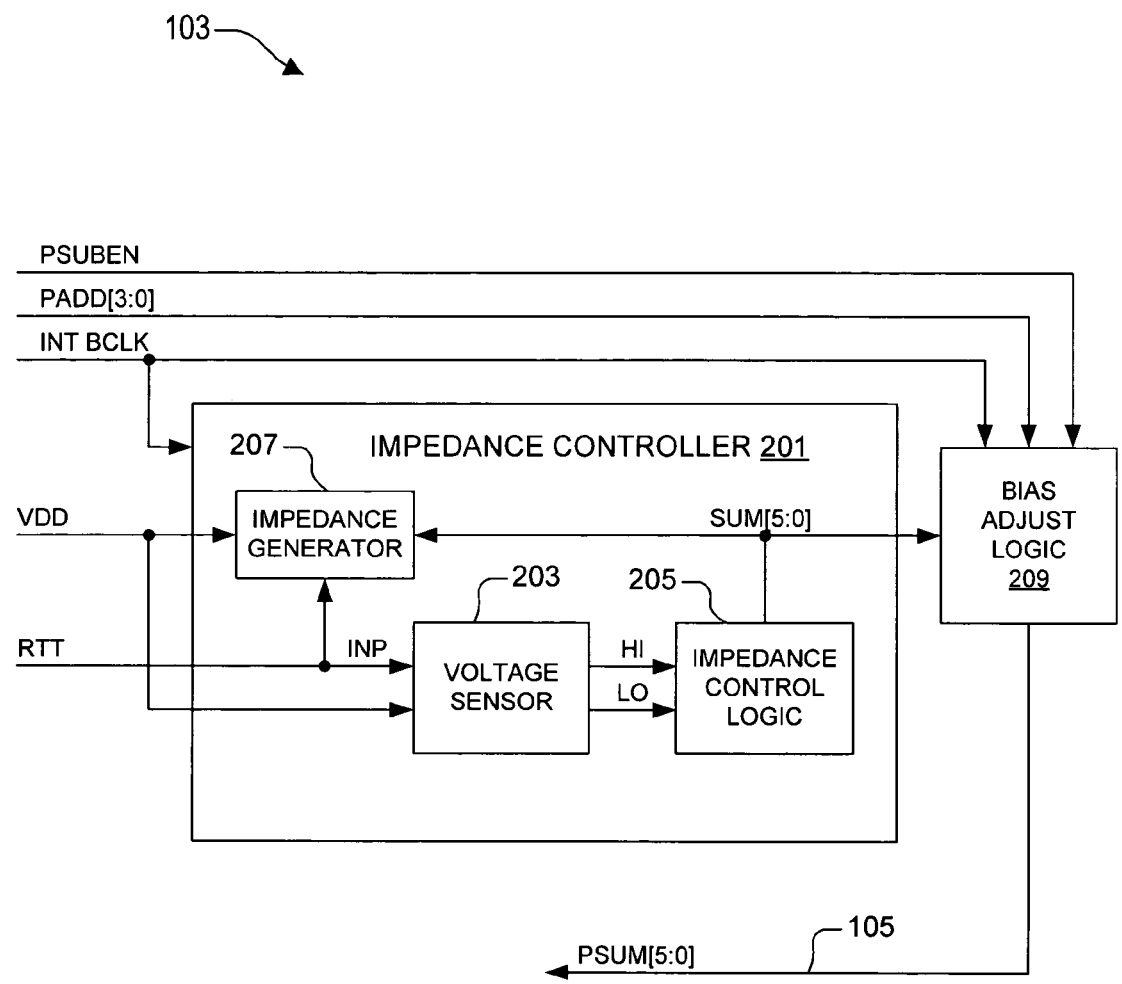
FIG. 2 is a more detailed block diagram of the impedance matching logic of FIG. 1 according to an exemplary embodiment of the present invention.

The IC 101 includes impedance matching logic 103, which receives the VDD signal and which monitors the impedances of the external reference resistor R and an internal impedance generator 207 (FIG. 2). In the embodiment shown, the impedance matching logic 103 monitors the voltage level of the RTT pin and provides a 6-bit digital value PSUM[5:0] over a 6-bit internal bus 105 to multiple termination or pull-up logic elements 107 (individually numbered from 1 to N) provided on the IC 101. Each of the individual pull-up logic elements 107 receives the VDD signal and is coupled to a corresponding one of the output pins OUTx (where "x" is any integer from 1 to N denoting a particular output pin). Within each of the pull-up logic elements 107, each bit of the PSUM[5:0] value enables/disables a corresponding group of an array of matched P-channel devices having a common drain point and employed to pull-up and terminate a corresponding OUTx pin. The PSUM[5:0] value specifies the number of P-channel devices that are to be turned on (or activated) within each of the pull-up logic elements 107 to pull-up and terminate the corresponding OUTx signal within a specified error. In the embodiment shown, the PSUM[5:0] value allows for adjustment of the impedance of the pull-up logic devices 107 in 64 equally-spaced steps.

In operation, the impedance matching logic 103 maintains a local binary array of matched P-channel devices that is substantially identical to the binary array in each of the pull-up logic elements 107. Each of the arrays are organized or divided into binary groups for digital output impedance control, as further described below. The impedance of the local binary array within the impedance matching logic 103 is continually monitored and the PSUM[5:0] value is adjusted up or down so that the voltage across the internal array is within a predetermined tolerance of the voltage across the resistor R. In one embodiment, the predetermined tolerance is an error voltage of approximately 50 milli-volts (mV). The optimum impedance of the pull-up logic elements 107 is determined or otherwise updated on selected cycles of a bus clock, INT BCLK (e.g., every two INT BCLK cycles), and the pull-up logic elements 107 are transparently updated.

Output bias logic 109 is provided to add or subtract bias to the PSUM[5:0] value provided over the bus 105. A 4-bit value PADD[3:0] is provided from the output bias logic 109 to the impedance matching logic 103 to identify an amount to be added to or subtracted from the PSUM[5:0] value. A control signal PSUBEN provided by the output bias logic 109 to the impedance matching logic 103 determines whether the amount is to be added (when PSUBEN is not asserted) or subtracted (when PSUBEN is asserted). In one embodiment, the PADD[3:0] value is directly added to (e.g., when PSUBEN is logic 0 or not asserted) or otherwise directly subtracted from (e.g., when PSUBEN is logic 1 or asserted) the PSUM[5:0] value. In an alternative embodiment, the PSUM[5:0] value is proportionally increased or decreased according to the value of PADD[3:0] and the PSUBEN signal. For example, if PADD[3:0] is set at 1000b (binary) and the PSUBEN signal is not asserted, then the PSUM[5:0] is increased by 50 percent.

In a particular embodiment, the output bias logic 109 includes or is otherwise programmed by a set of fuses 110 incorporated on the IC 101. For example, the programmed state of the set of fuses 110 is determined by a test procedure or the like on a part-by-part basis. All but one of the set of fuses 110 corresponds to lower bits of PSUM[5:0] value. In this manner, blowing selected fuses allows a designer to increase or decrease the of PSUM[5:0] value. The output bias logic 109 is a control mechanism that enables a designer to compensate for process variations across the IC 101.

FIG. 2 is a more detailed block diagram of the impedance matching logic 103 according to an exemplary embodiment of the present invention. The impedance matching logic 103 includes an impedance controller 201, which receives the INT BCLK, VDD and RTT signals. The R controller 201 includes a voltage sensor 203 which receives the VDD signal and which monitors the voltage of the RTT pin, shown locally as a signal INP. The INP signal is provided to the impedance generator 207, which presents an impedance between the VDD and INP signals based on a 6-bit input control value SUM[5:0]. The voltage sensor 203 effectively compares the voltages of the VDD and INP signals and generates signals HI and LO to impedance control logic 205 in an attempt to equalize the voltage levels across the impedance generator 207 and the resistor R within a predetermined tolerance. The impedance control logic 205 increments/decrements the SUM[5:0] value in response to the HI/LO signals to control the impedance of the impedance generator 207 until VDD−INP=INP within the predetermined error voltage (or so that the voltage of the INP signal is one-half the voltage of VDD within the predetermined error voltage). In other words, the voltage sensor 203 and the impedance control logic 205 cooperate in attempt to equalize the impedance (via voltage) of the impedance generator 207 with the impedance (via voltage) of the resistor R within the predetermined tolerance (via error voltage amount).

The VDD source voltage is divided by the resistor R and the impedance of the impedance generator 207 to provide an intermediate voltage of the INP signal. If the voltage of the INP signal is too high indicating that the impedance of the impedance generator 207 is too low (or less than R), then the voltage sensor 203 asserts the HI signal and negates the LO signal. The impedance control logic 205 responds by decrementing the SUM[5:0] value to increase the impedance of the impedance generator 207. The voltage sensor 203 asserts the LO signal and negates the HI signal when the INP signal is too low indicating that the impedance of the impedance generator 207 is too high relative to the resistor R. The impedance control logic 205 responds by incrementing the SUM[5:0] value to decrease the impedance of the impedance generator 207. In the embodiment shown and described, the SUM[5:0] value is inversely proportional to the impedance of the impedance generator 207, although a proportional relationship is also contemplated.

In one embodiment, the voltage sensor 203 includes a pair of sense amplifiers (not shown) having voltage reference settings separated by the predetermined error voltage relative to one-half the voltage of VDD. In this case, a high sense amplifier has a set point of about one-half the error voltage above ½ VDD for controlling the HI signal and the low sense amplifier has a set point of one-half the error voltage below ½ VDD for controlling the LO signal. Each sense amplifier compares the voltage of the INP signal relative to its set point. If the voltage of the INP signal rises above one-half the error voltage, then HI is asserted, if INP falls below one-half the error voltage, then LO is asserted, and if INP is within one-half of the error voltage of ½ VDD, then neither HI or LO is asserted and no action is taken. In a more specific embodiment, the predetermined error voltage is approximately 50 mV so that the high sense amplifier is set to approximately 25 mV above ½ VDD while the low sense amplifier is set to approximately 25 mV below ½ VDD. The gap of the error voltage can be set for a tight tolerance for greater accuracy or otherwise set to a relatively wide tolerance to save power.

In one embodiment, the impedance control logic 205 is a digital circuit controlled by the INT BCLK signal, and adjusts (e.g., increments or decrements) the SUM[5:0] value during selected cycles of the INT BCLK signal, such as every clock cycle or every other clock cycle, etc.

The INT BCLK and SUBEN signals, the PADD[5:0] value and the SUM[5:0] value are provided to bias adjustment logic 209, which outputs the PSUM[5:0] value. During selected cycles of the clock signal INT BCLK, such as every other clock cycle or the like, the bias adjustment logic 209 adjusts (e.g., increases or decreases) the PSUM[5:0] value based on the PADD[3:0] value and the control signal PSUBEN. As previously described, in one embodiment the PADD[3:0] value is either added to or subtracted from the SUM[5:0] value and in another embodiment, the SUM[5:0] value is either proportionally increased or decreased according to the PADD[3:0] value. The final result is asserted by the bias adjustment logic 209 as the PSUM[5:0] value on the bus 105 of the IC 101. In this manner, the PSUM[5:0] value is a bias-adjusted version of the SUM[5:0] value.

Figure 3:
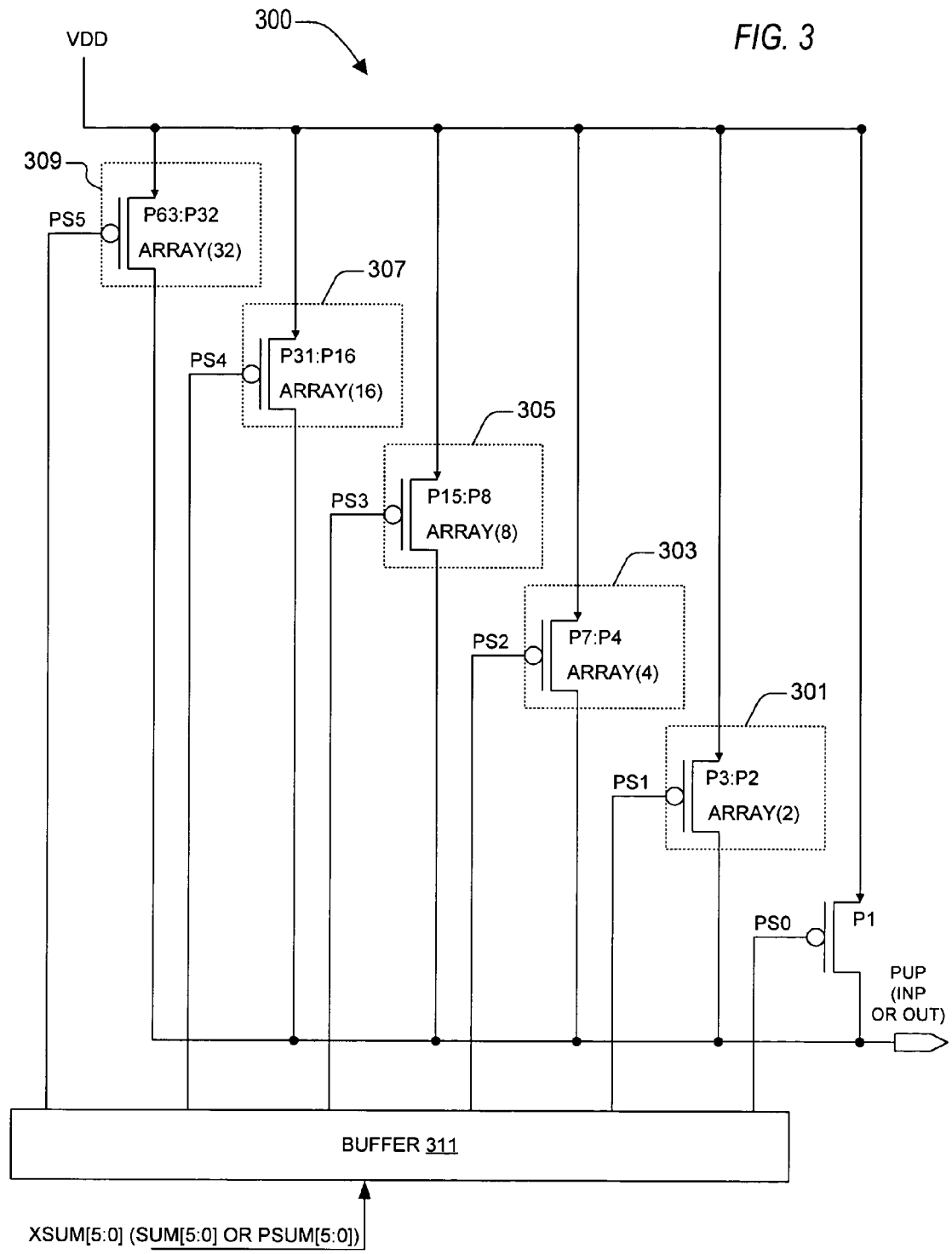
FIG. 3 is a schematic diagram of an impedance generator implemented according to an exemplary embodiment of the present invention, which may be used to implement the impedance generator of FIG. 2 and/or to implement any of the pull-up logic elements of FIG. 1.

FIG. 3 is a schematic diagram of an impedance generator 300 implemented according to an exemplary embodiment of the present invention, which may be used to implement the impedance generator 207 and/or to implement any of the pull-up logic elements 107. The impedance generator 300 includes a binary array of 63 P-channel devices P1–P63 (or P63:N1). In one embodiment, each of the P-channel devices P63:P1 are matched so that the drain to source impedance is substantially the same. The source of each of the devices P63:P1 is coupled to VDD and the drain is coupled to a pull-up signal PUP, which represents the INP signal of the impedance generator 207 or the corresponding OUTx signal of any of the pull-up logic elements 107. The devices P63:P1 are binarily grouped to correspond to each of the six bits of a binary impedance value XSUM[5:0], which represents the SUM[5:0] value when implementing the impedance generator 207 or the PSUM[5:0] value when implementing any of the pull-up logic elements 107. A first array group is the sole device P1 having a gate which receives a signal PS0, a second array group 301 includes two devices P2 and P3 (P3:P2) each having gates receiving a signal PS1, a third array group 303 includes four devices P4–P7 (P7:P4) each having gates receiving a signal PS2, a fourth array group 305 includes eight devices P8–P15 (P15:P8) each having gates receiving a signal PS3, a fifth array group 307 includes 16 devices P16–P31 (P31:P16) each having gates receiving a signal PS4, and a sixth array group 309 includes 32 devices P32–P63 (P63:P31) each having gates receiving a signal PS5.

The PS5–PS0 signals collectively form a binary value asserted by a buffer 301, which receives the XSUM[5:0] value. Each of the PS5–PS0 signals is a buffered version of the corresponding bit of the XSUM[5:0] value. For example, the XSUM5 bit is buffered to generate the PS5 signal, the XSUM4 bit is buffered to generate the PS4 bit, and so on. Thus, as the XSUM[5:0] value is incremented or increased, the impedance between the VDD and PUP signals is decreased and vice-versa. For example, an XSUM[5:0] value of 100000b activates the array group 309 coupling approximately half (or 32) of the P-channel devices in parallel, while an XSUM[5:0] value of 100001b activates array groups P1 and 309 coupling 33 of the P-channel devices in parallel, while an XSUM[5:0] value of 100010b activates array groups 303 and 309 coupling 34 of the P-channel devices in parallel, and so on. An XSUM[5:0] value of 000000b turns off all of the P-channel devices for a high impedance state while a value of 111111b activates all 63 of the P-channel devices for the lowest impedance level. In one embodiment, the array of devices P63:P1 are sized and grouped to provide a pull-up impedance ranging from approximately 20 to 150 ohms for the expected range of operating temperatures and bus voltage conditions, leaving margin as well for anticipated fabrication process variations.

FIG. 4 is a flowchart diagram illustrating a method of controlling the pull-up termination impedance of at least one output based on a reference resistance according to an exemplary embodiment of the present invention. At first block 401, an optional bias adjust value is programmed. In the specific IC embodiment as previously described, blowing selected fuses incorporated on the IC 101 provides a control mechanism to compensate for process variations across the IC 101. At next block 403, a reference voltage is applied across a reference impedance generator having a reference impedance input and the reference resistance. In the embodiment illustrated, the reference voltage may be a voltage source, such as the VDD signal or the like, which is applied across the reference resistance and the reference impedance input coupled in series.

At next block 405, the reference impedance input is periodically (e.g., continuously) adjusted to equalized impedance of the reference impedance generator with the reference resistance within a predetermined tolerance. In the illustrated embodiment, a voltage is sensed at an intermediate junction between the reference resistance and the reference impedance generator and compared with one-half of the reference voltage (e.g., VDD). At next block 407, selected ones of a binary array of matched impedance devices of the reference impedance generator are activated based on the reference impedance input. In the illustrated embodiment, the reference impedance input is a digital value in which each bit activates a selected group of an array of matched P-channel devices.

At next block 409, the termination impedance input provided to each pull-up impedance generator coupled to a corresponding output is controlled based on the reference impedance input. If a bias adjust value is programmed, the bias adjust value is combined with the reference impedance input to adjust the termination impedance input at next block 411. In the illustrated embodiment, the bias adjustment logic 209 incorporates (adds, subtracts, or otherwise combines) the PADD[5:0] value to the SUM[5:0] value to generate the PSUM[5:0] value routed to each of the pull-up logic elements 107. At next block 413, selected ones of a binary array of matched impedance devices of the pull-up impedance generator are activated based on the termination impedance input. As previously described, each of the pull-up logic elements 107 includes the same configuration of matched P-channel devices as the reference impedance generator 207, so that the output pull-up termination impedance is based on the reference impedance and any output bias adjustment.

An impedance controller according to embodiments of the present invention continuously adjusts the termination impedance of each pull-up termination device of an IC during operation in a transparent manner. The termination impedance is continuously monitored and adjusted to compensate for temperature, voltage, and fabrication process variations in a manner that is transparent to the primary operation of the circuit. Fluctuations of the VDD signal do not effect the termination impedance at the outputs since the variations occur in proportional manner to the INP signals. The resistor R provides the benefit of being independent of the temperature variations of the IC 101.

Although the present invention has been described in considerable detail with reference to certain preferred versions thereof, other versions and variations are possible and contemplated. For example, various alternative methods are contemplated for equalizing impedance of the programmable impedance generator 207 with the reference resistor, such as current techniques or the like. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An impedance controller that controls termination impedance of at least one output based on a reference value, comprising:
    a programmable reference impedance generator that develops a reference impedance controlled by a reference impedance control input;
    at least one termination logic element, each including a programmable termination impedance generator coupled to a corresponding output and controlled by termination impedance control input; and
    an impedance matching controller that continually adjusts said reference impedance control input to match said reference impedance with the reference value within a predetermined tolerance and that generates said termination impedance control input based on said reference impedance control input;
    wherein said impedance matching controller further comprises bias adjustment logic that combines a bias amount with said reference impedance control input to provide said termination impedance control input.

2. The impedance controller of claim 1, wherein said programmable reference impedance generator and each of said at least one programmable termination impedance generator comprises a binary array of matched P-channel devices.

3. The impedance controller of claim 1, wherein said programmable reference impedance generator and each of said at least one programmable termination impedance generator each provide a pull-up impedance relative to a source voltage.

4. The impedance controller of claim 1, wherein said impedance matching controller comprises:
    a voltage sensor that senses a voltage difference between a reference voltage developed across a reference device and a voltage of said programmable reference impedance generator and that asserts an error signal indicative thereof; and
    impedance control logic that adjusts said reference impedance control input based on said error signal.

5. The impedance controller of claim 4, wherein the reference device comprises a reference resistor, wherein a voltage source is applied across said reference resistor and said programmable reference impedance generator coupled in series at an intermediate junction, and wherein said voltage sensor asserts said error signal indicative of voltage of said intermediate junction relative to one-half of a voltage level of said voltage source.

6. The impedance controller of claim 4, wherein said impedance control logic receives a clock signal and increments or decrements said reference impedance control input during selected cycles of said clock signal.

7. The impedance controller of claim 1, further comprising output bias logic that is programmed to provide said bias amount.

8. The impedance controller of claim 7, wherein said output bias logic comprises a plurality of programmable fuses.

9. An integrated circuit (IC), comprising:
    a plurality of pins including a reference pin for coupling to an external reference resistor and at least one output pin;
    at least one termination logic element each including a programmable termination impedance generator controlled by a termination impedance control input and coupled to a corresponding one of said at least one output pin; and
    impedance matching logic, comprising:
        a programmable reference impedance generator controlled by a reference impedance control input;
        comparator logic that continually adjusts said reference impedance control input to equalize values of said reference resistor and said programmable reference impedance generator within a predetermined tolerance;
        output bias logic that provides an adjustment value; and
        output termination logic that controls said termination impedance control input based on said reference impedance control input and said adjustment value.

10. The IC of claim 9,
    wherein said output termination logic further comprises bias adjustment logic that combines said reference impedance control input with said adjustment value to provide said termination impedance control input.

11. The IC of claim 10, wherein said output bias logic comprises a plurality of programmable fuses.

12. The IC of claim 10, wherein said programmable reference impedance generator and each said programmable termination impedance generator comprises a binary array of matched P-channel impedance devices.

13. The IC of claim 9, wherein said comparator logic comprises:
    a voltage sensor, coupled to said reference pin and to said programmable reference impedance generator, that detects voltages across said reference resistor and said programmable reference impedance generator and that asserts an error signal indicative thereof; and
    impedance control logic that adjusts said reference impedance control input based on said error signal.

14. The IC of claim 13, wherein a reference voltage is applied across said reference resistor and said programmable reference impedance generator coupled in series at a junction and wherein said voltage sensor asserts said error signal indicative of a voltage of said junction within a predetermined error voltage of one-half of said reference voltage.

15. The IC of claim 13, said reference impedance control input comprising a digital value, wherein said impedance control logic receives a clock signal and increments or decrements said reference impedance control input during selected cycles of said clock signal.

16. A method of controlling pull-up termination impedance of at least one output based on a reference resistance, comprising:

applying a reference voltage across the reference resistance and a reference impedance generator coupled in series, the reference impedance generator having a reference impedance input;

periodically adjusting the reference impedance input to equalize voltages of the reference impedance generator and the reference resistance within a predetermined tolerance;

programming a bias adjust value; and controlling a termination impedance input of at least one pull-up impedance generator based on the reference impedance input and the bias adjust value, wherein each pull-up impedance generator is coupled to a corresponding output.

17. The method of claim 16, further comprising:

sensing voltage at an intermediate junction of the reference impedance generator and the reference resistance; and said periodically adjusting comprising comparing the voltage at the intermediate junction with one-half of the reference voltage.

18. The method of claim 16, wherein said periodically adjusting the reference impedance input comprises incrementing or decrementing a digital value during selected cycles of a clock signal.

19. The method of claim 16, wherein said controlling a termination impedance input comprising combining the bias adjust value with the reference impedance input.

20. The method of claim 16, further comprising:

activating selected ones of a binary array of matched P-channel devices of the reference impedance generator based on the reference impedance input; and activating selected ones of a binary array of matched P-channel devices of each pull-up impedance generator based on the termination impedance input.

* * * * *